United States Patent
Kim et al.

(10) Patent No.: US 9,634,286 B2
(45) Date of Patent: Apr. 25, 2017

(54) DISPLAY PANEL AND MANUFACTURING METHOD OF THE SAME

(71) Applicant: Samsung Display Co., Ltd., Yongin, Gyeonggi-Do (KR)

(72) Inventors: Min-Soo Kim, Yongin (KR); Jin-Woo Park, Yongin (KR); Won-Sik Hyun, Yongin (KR)

(73) Assignee: SAMSUNG DISPLAY CO., LTD, Gyeonggi-do (KR)

( * ) Notice: Subject to any disclaimer, the term of this patent is extended or adjusted under 35 U.S.C. 154(b) by 0 days.

(21) Appl. No.: 14/808,344

(22) Filed: Jul. 24, 2015

(65) Prior Publication Data

US 2015/0333294 A1 Nov. 19, 2015

Related U.S. Application Data

(62) Division of application No. 13/779,319, filed on Feb. 27, 2013, now abandoned.

(30) Foreign Application Priority Data

Aug. 31, 2012 (KR) .................. 10-2012-0096787

(51) Int. Cl.
 *H01L 51/52* (2006.01)
 *H01L 27/32* (2006.01)

(52) U.S. Cl.
 CPC ...... *H01L 51/5253* (2013.01); *H01L 51/5221* (2013.01); *H01L 51/5243* (2013.01);
 (Continued)

(58) Field of Classification Search
 CPC .............. H01L 51/5253; H01L 51/524; H01L 51/5262; H01L 51/5246; H01L 2227/323; B32B 3/04
 See application file for complete search history.

(56) References Cited

U.S. PATENT DOCUMENTS 2,642,633 A 6/1953 Dalton
4,314,031 A 2/1982 Sanford et al.
(Continued)

FOREIGN PATENT DOCUMENTS

JP 2007-115529 A 5/2007
KR 10-2008-0045217 A 5/2008
(Continued)

OTHER PUBLICATIONS

Burrows et al., "Reliability and degradation of organic light emitting devices," *Appl. Phys. Lett.*, 1994, 65(23): 2922-2924.
(Continued)

*Primary Examiner* — Allen Parker
*Assistant Examiner* — Stephen Bradley
(74) *Attorney, Agent, or Firm* — Knobbe, Martens, Olson & Bear LLP

(57) ABSTRACT

In one aspect, a display panel and a manufacturing method of the same is provided. The display panel includes a non-emission region layer having a plurality of emission regions and a connection region that is open to connect adjacent emission regions; an organic emission layer formed in each of the plurality of emission regions; a counter electrode formed in the emission regions and the connection region; and an encapsulation layer formed on the counter electrode.

11 Claims, 19 Drawing Sheets

(52) U.S. Cl.
CPC ...... *H01L 51/5246* (2013.01); *H01L 27/3246* (2013.01); *H01L 27/3248* (2013.01); *H01L 2227/323* (2013.01); *H01L 2251/301* (2013.01); *H01L 2251/556* (2013.01); *H01L 2251/562* (2013.01)

(56) References Cited

U.S. PATENT DOCUMENTS

| | | | |
|---|---|---|---|
| 5,089,446 | A | 2/1992 | Cornelius et al. |
| 7,722,929 | B2 | 5/2010 | Aitken et al. |
| 7,749,811 | B2 | 7/2010 | Aitken et al. |
| 7,829,147 | B2 | 11/2010 | Aitken et al. |
| 8,363,072 | B2 | 1/2013 | Hong et al. |
| 2004/0056589 | A1 | 3/2004 | Yamazaki et al. |
| 2007/0040501 | A1* | 2/2007 | Aitken et al. ............... 313/512 |
| 2007/0105255 | A1* | 5/2007 | Nishimura ................... 438/34 |
| 2008/0036097 | A1* | 2/2008 | Ito ........................ C08L 63/00 257/778 |
| 2011/0140373 | A1 | 6/2011 | Lee et al. |
| 2011/0220900 | A1* | 9/2011 | Ha ....................... H01L 27/3276 257/59 |
| 2011/0291118 | A1* | 12/2011 | Kwon et al. ................. 257/88 |
| 2012/0068169 | A1* | 3/2012 | Hirase ................ H01L 51/5246 257/40 |
| 2012/0313099 | A1 | 12/2012 | Chung et al. |

FOREIGN PATENT DOCUMENTS

| | | |
|---|---|---|
| KR | 10-0903245 B1 | 6/2009 |
| KR | 10-2010-0050470 A | 5/2010 |
| TW | 200410594 A | 9/2002 |

OTHER PUBLICATIONS

Chatham, H., "Review: Oxygen diffusion barrier properties of transparent oxide coatings on polymeric substrates," *Surface and Coatings Technology*, 1996, 78: 1-9.

Popovic et al., "Reliability and Degradation of Small Molecule-Based Organic Light-Emitting Devices (OLEDs)", *IEEE Journal on Selected Topics in Quantum Electronics*, 2002, 8(2):362-371.

Forsythe, E.W., "Seminar M-5: Operation of Organic-Based Light-Emitting Devices," *Society for Information Display (SID) 40th Anniversary Seminar Lecture Notes*, vol. 1: May 20, 2002, pp. M-5/1-M-5/50, Society for Information Display, San Jose, CA.

Office Action issued by the Taiwanese Patent Office on Jul. 14, 2016 in the examination of the Taiwan Patent Application No. 102106126, which corresponds to above U.S. Application (English Translation).

* cited by examiner

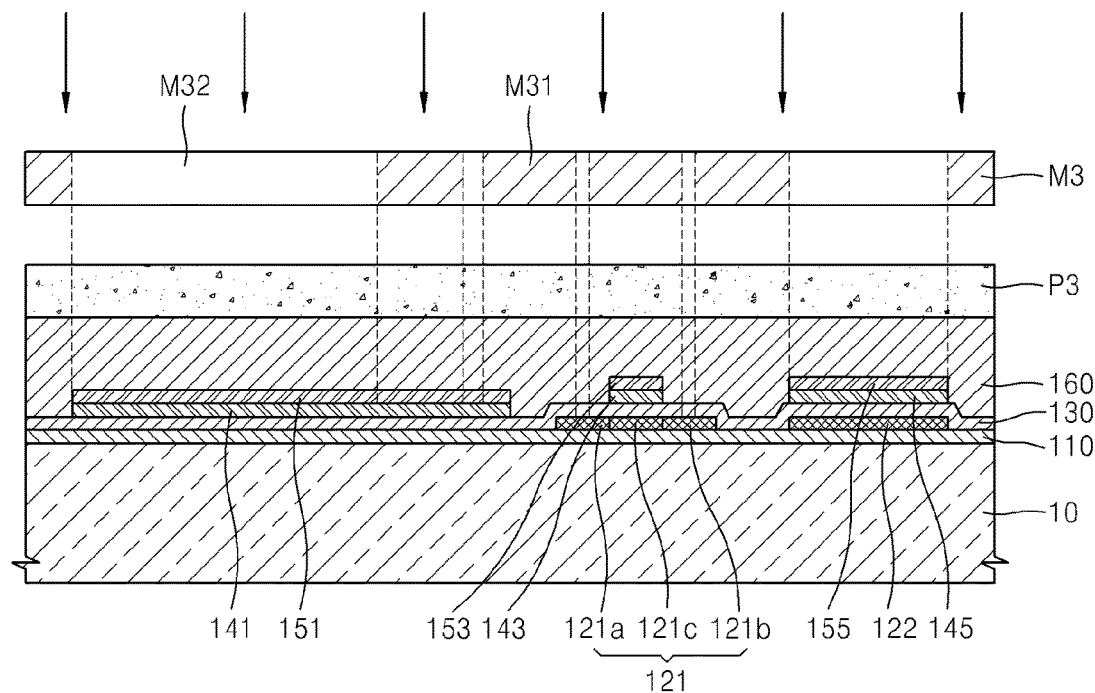
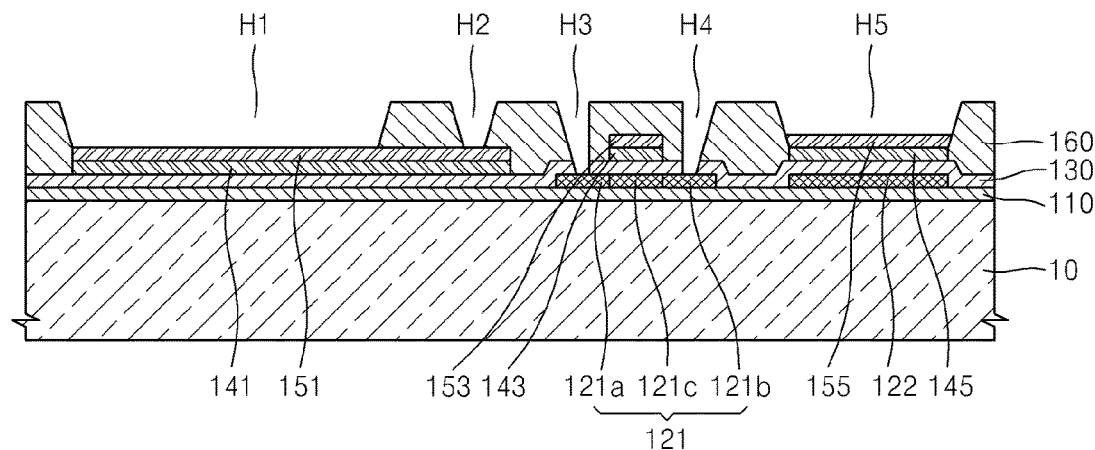

DISPLAY PANEL AND MANUFACTURING METHOD OF THE SAME

CROSS-REFERENCE TO RELATED APPLICATION

This application is a divisional application of U.S. patent application Ser. No. 13/779,319 filed Feb. 27, 2013, now pending, which claims the benefit of Korean Patent Application No. 10-2012-0096787, filed on Aug. 31, 2012 in the Korean Intellectual Property Office, the disclosure of which is incorporated herein by reference in its entirety.

BACKGROUND

Field

The described technology generally relates to an apparatus and a manufacturing method, and more particularly, to a display panel and a manufacturing method of the same.

Description of the Related Technology

An organic light emitting display apparatus includes a positive electrode, a negative electrode, and an organic emission layer formed between the positive and negative electrodes where electrons and holes are re-combined in the organic emission layer so as to emit light.

Also, organic light emitting display may include a self-emissive display apparatus including a display panel to emit light as described above. Such self-emissive display panel may have excellent characteristics as a display device due to a wide viewing angle, a fast response speed, and low power consumption as well as a light weight and a small thickness.

Additionally, a display panel for displaying full colors may employ an optical resonance structure for varying an optical length of a wavelength emitted from an organic emission layer of each of different color pixels, for example, red, green, and blue pixels.

SUMMARY

The present embodiments provide a display panel capable of preventing penetration of oxygen and moisture and broadening a life time, and a manufacturing method of the same.

Some embodiments provide a display panel including a non-emission region layer having a plurality of emission regions and a connection region that is open to connect adjacent emission regions; an organic emission layer formed in each of the plurality of emission regions; a counter electrode formed in the emission regions and the connection region; and an encapsulation layer formed on the counter electrode.

In some embodiments, the counter electrode may include a plurality of first counter electrodes individually formed on the organic emission layers; and a second counter electrode formed in the connection region.

In some embodiments, the encapsulation layer may be formed of a low liquidus temperature material.

In some embodiments, the low liquidus temperature material may include at least one of tin fluorophosphates glass, tungsten-doped tin fluorophosphates glass, chalcogenide glass, tellurite glass, borate glass, and phosphate glass.

In some embodiments, the tin fluorophosphates glass may include 20 to 80 weight % of tin (Sn), 2 to 20 weight % of phosphorus (P), 3 to 20 weight % of oxygen (O), and 10 to 36 weight % of fluorine (F).

In some embodiments, the encapsulation layer may have a melting point equal to or less than 200° C. In some embodiments, the encapsulation layer may have a melting point in the range of from about 150° C. to about 200° C.

Some embodiments provide a manufacturing method of a display panel, the method including forming a non-emission region layer having a plurality of emission regions and a connection region that is open to connect adjacent emission regions; a second step of forming an encapsulation layer on the non-emission region layer where the plurality of emission regions and the connection region are not formed; a third step of forming an organic emission layer in each of the emission regions; and a fourth step of forming a counter electrode in the emission regions and the connection region, and melting the encapsulation layer to seal the counter electrode.

In some embodiments, the second step may include a step of forming a mask for blocking the emission regions and the connection region; and a step of patterning the encapsulation layer on the non-emission region layer by using the mask.

In some embodiments, the encapsulation layer may be formed on at least a portion of the non-emission region layer.

In some embodiments, the fourth step may include a step of tilting the non-emission region layer, the encapsulation layer, and the organic emission layer by a certain angle with respect to a ground surface.

In some embodiments, the fourth step may include a step of melting the encapsulation layer to a temperature equal to or less than 200° C.

In some embodiments, the counter electrode may include a plurality of first counter electrodes individually formed on the organic emission layers; and a second counter electrode for connecting the plurality of first counter electrodes.

In some embodiments, the encapsulation layer may be formed of a low liquidus temperature material.

In some embodiments, the low liquidus temperature material may include at least one of tin fluorophosphates glass, tungsten-doped tin fluorophosphates glass, chalcogenide glass, tellurite glass, borate glass, and phosphate glass.

In some embodiments, the tin fluorophosphates glass may include 20 to 80 weight % of tin (Sn), 2 to 20 weight % of phosphorus (P), 3 to 20 weight % of oxygen (O), and 10 to 36 weight % of fluorine (F).

BRIEF DESCRIPTION OF THE DRAWINGS

The above and other features and advantages of the present embodiments will become more apparent by describing in detail exemplary embodiments thereof with reference to the attached drawings in which:

FIGS. 2 through 18 are diagrams for describing a manufacturing method of the display panel illustrated in FIG. 1.

DETAILED DESCRIPTION

Hereinafter, the present disclosure will be described in detail by explaining aspects of the embodiments with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list.

Figure 1:
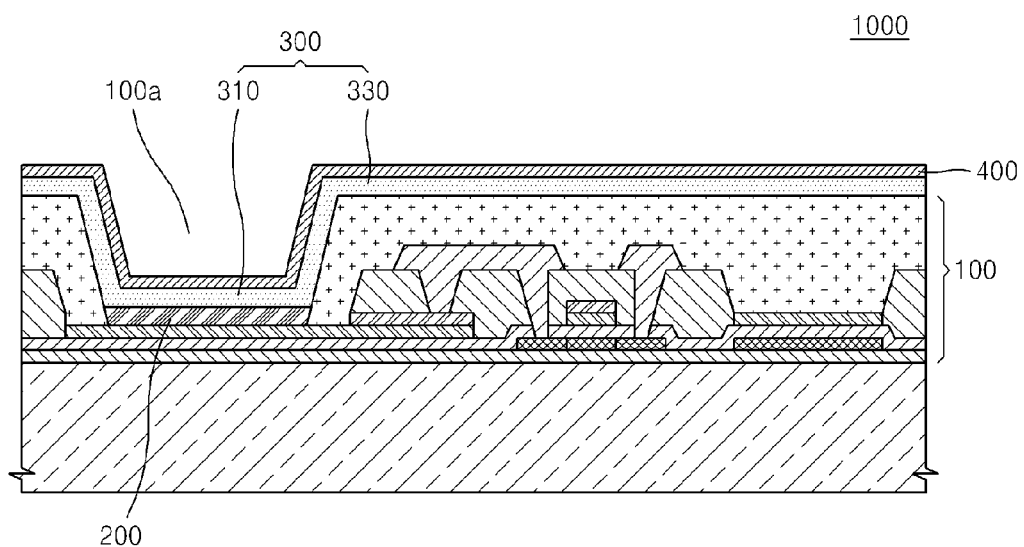
FIG. 1 is a cross-sectional view of a display panel according to an aspect of the present embodiments.

FIG. 1 is a cross-sectional view of a display panel 1000 according to an embodiment.

Referring to FIG. 1, the display panel 1000 may include a non-emission region layer 100 in which a plurality of emission regions 100a are formed. In some embodiments, the non-emission region layer 100 may include a connection region (not shown) that is open to connect the emission regions 100a. Particularly, the connection region may be formed as a groove in the non-emission region layer 100.

In some embodiments, the display panel 1000 may include an organic emission layer 200 formed each of in the emission regions 100a.

In some embodiments, the display panel 1000 may include a counter electrode 300 formed on the non-emission region layer 100 to connect adjacent emission regions 100a. In some embodiments, the counter electrode 300 may include a plurality of first counter electrodes 310 individually formed on the organic emission layers 200, and a second counter electrode 330 formed in the connection region. The first and second counter electrodes 310 and 330 will be described in detail below.

In some embodiments, the second counter electrode 330 may be formed in the connection region of the non-emission region layer 100 where the emission regions 100a are not formed. In some embodiments, the second counter electrode 330 may connect the first counter electrodes 310 formed in the emission regions 100a.

In some embodiments, the display panel 1000 may include an encapsulation layer 400 formed on the counter electrode 300. In some embodiments, the encapsulation layer 400 may be patterned and bonded onto only a portion where the counter electrode 300 is not formed and then may be melted by heat so as to cover the counter electrode 300. In some embodiments, the encapsulation layer 400 may be formed on the non-emission region layer 100 where the emission regions 100a and the connection region are not formed.

In some embodiments, the encapsulation layer 400 may be formed of a low liquidus temperature (LLT) material. In some embodiments, the encapsulation layer 400 may include at least one of tin fluorophosphates glass, tungsten-doped tin fluorophosphates glass, chalcogenide glass, tellurite glass, borate glass, and phosphate glass.

In some embodiments, the tin fluorophosphates glass may include 20 to 80 weight % of tin (Sn), 2 to 20 weight % of phosphorus (P), 3 to 20 weight % of oxygen (O), and 10 to 36 weight % of fluorine (F).

In some embodiments, the encapsulation layer 400 may have a melting point equal to or less than 200° C. Accordingly, if the encapsulation layer 400 is formed and then is melted, damage of components of the display panel 1000 due to heat may be prevented.

A manufacturing method of the display panel 1000 will now be described in detail.

FIGS. 2 through 18 are diagrams for describing a manufacturing method of the display panel illustrated in FIG. 1.

Referring to FIGS. 2 through 18, in order to manufacture the display panel 1000, initially, the non-emission region layer 100 may be formed. In some embodiments, a buffer layer 110 and a semiconductor layer 120 may be sequentially formed on a substrate 10.

Figure 2:
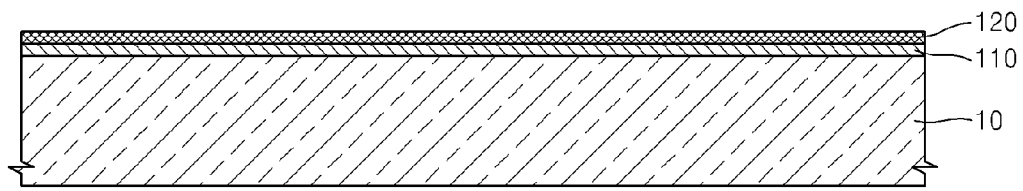

Referring to FIG. 2, the substrate 10 may be formed of a transparent glass material including $SiO_2$ as a main component. In some embodiments, the buffer layer 110 including, for example, $SiO_2$ and/or $SiN_x$ may be formed on the substrate 10 to planarize the substrate 10 and to prevent penetration of an impure element.

In some embodiments, the buffer layer 110 and the semiconductor layer 120 may be vapor-deposited by using various vapor deposition methods such as plasma enhanced chemical vapor deposition (PECVD), atmospheric pressure chemical vapor deposition (APCVD), and low pressure chemical vapor deposition (LPCVD).

In some embodiments, the semiconductor layer 120 may be vapor-deposited on the buffer layer 110. In some embodiments, the semiconductor layer 120 may be formed of amorphous silicon or poly silicon. In some embodiments, poly silicon may be formed by crystallizing amorphous silicon. A method of crystallizing amorphous silicon includes various methods such as rapid thermal annealing (RTA), solid phase crystallization (SPC), excimer laser annealing (ELA), metal induced crystallization (MIC), metal induced lateral crystallization (MILC), and sequential lateral solidification (SLS).

Figure 3:
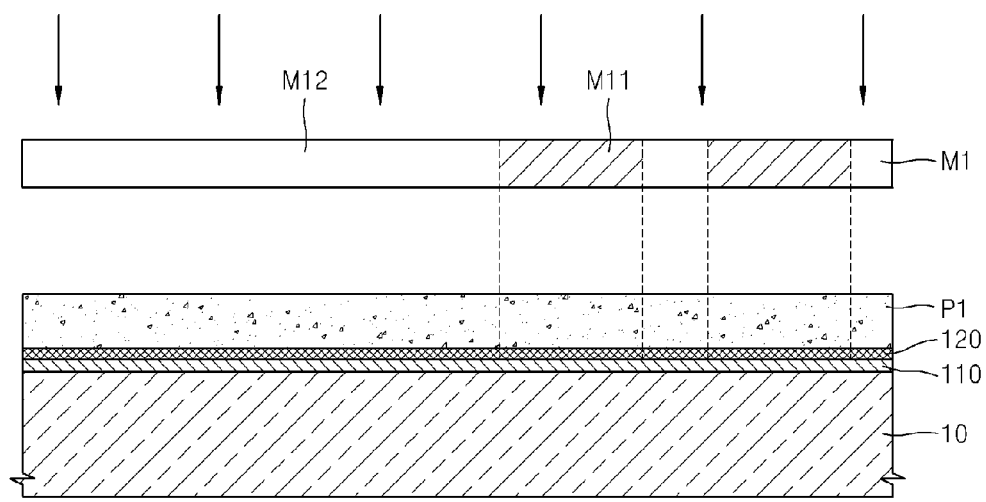

Referring to FIG. 3, a first photoresist P1 is coated on the semiconductor layer 120, and a first mask process is performed by using a first photomask M1 including light blocking parts M11 and light transmitting parts M12.

Although not shown in FIG. 3, in some embodiments of the first mask process, the first photomask M1 may be exposed to light by using an exposure device (not shown) and then a series of processes such as developing, etching, and stripping or ashing are performed.

Figure 4:
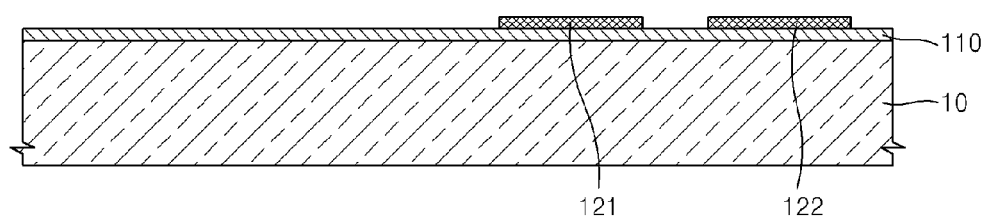

Referring to FIG. 4, as a result of the first mask process, the semiconductor layer 120 is formed as an active layer 121 of a thin film transistor (TFT). In some embodiments, the semiconductor layer 120 is patterned into a first electrode 122 of a capacitor which is formed of the same material as and at the same level as the active layer 121.

In some embodiments, the etching method is not limited to positive lithography to etch portions corresponding to the light transmitting parts M12 as shown in FIGS. 3 and 4, and negative lithography may also be used to etch portions corresponding to the light blocking parts M11. The above principle is also applied to the following processes.

Figure 5:
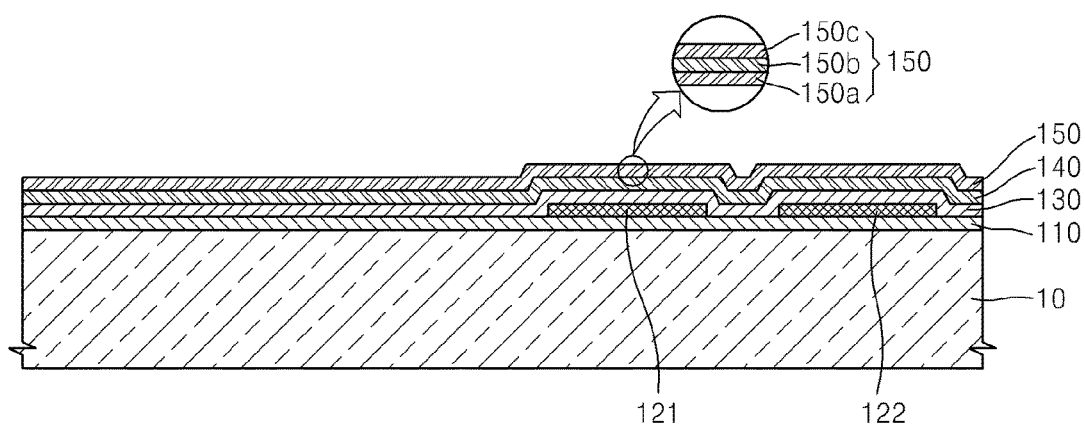

In some embodiments, as illustrated in FIG. 5, a first insulating layer 130, a first transparent conductive layer 140, and a first metal layer 150 are sequentially stacked on the structure of FIG. 4.

In some embodiments, the first insulating layer 130 may include a single or multiple layers of $SiO_2$, $SiN_x$, etc. and functions as a gate insulating layer of the TFT and a dielectric layer of the capacitor.

In some embodiments, the first transparent conductive layer 140 may include at least one selected from the group consisting of indium tin oxide (ITO), indium zinc oxide (IZO), zinc oxide (ZnO), indium oxide (In$_2$O$_3$), indium gallium oxide (IGO), and aluminium zinc oxide (AZO).

In some embodiments, the first metal layer 150 may include at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In some embodiments, the first metal layer 150 shown in FIG. 5 may include Al.

In some embodiments, the first metal layer 150 may include a plurality of metal layers 150*a*, 150*b*, and 150*c*. In some embodiments, Al may be used to form the metal layer 150*b* in the middle and Mo is used to form the metal layers 150*a* and 150*c* at the top and the bottom, thereby forming a triple layer structure of Mo/Al/Mo. However, the first metal layer 150 is not limited thereto, and may be formed by using various materials and various layers.

Figure 6:
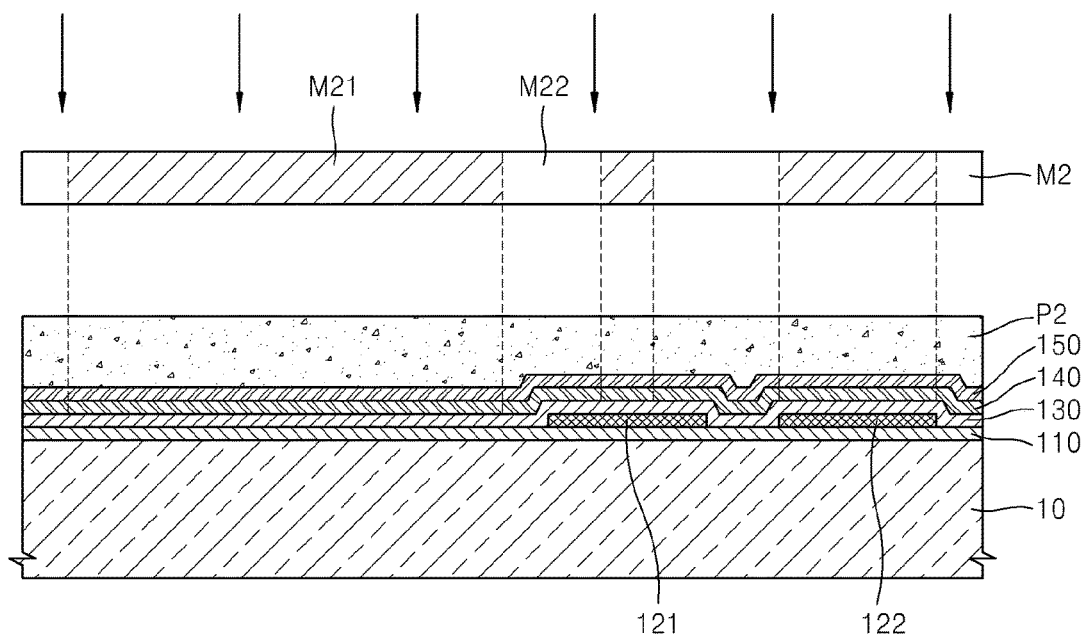

Referring to FIG. 6, a second photoresist P2 may be coated on the first metal layer 150, and a second mask process is performed by using a second photomask M2 including light blocking parts M21 and light transmitting parts M22.

Figure 7:
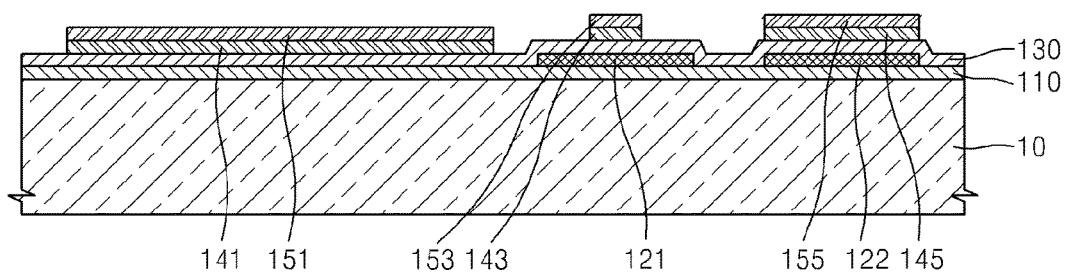

As a result of the second mask process, as illustrated in FIG. 7, the first transparent conductive layer 140 and the first metal layer 150 are respectively patterned into a base layer 141 and 151 of a pixel electrode, a gate electrode 143 and 153 of the TFT, and a second electrode 145 and 155 of the capacitor.

Figure 8:
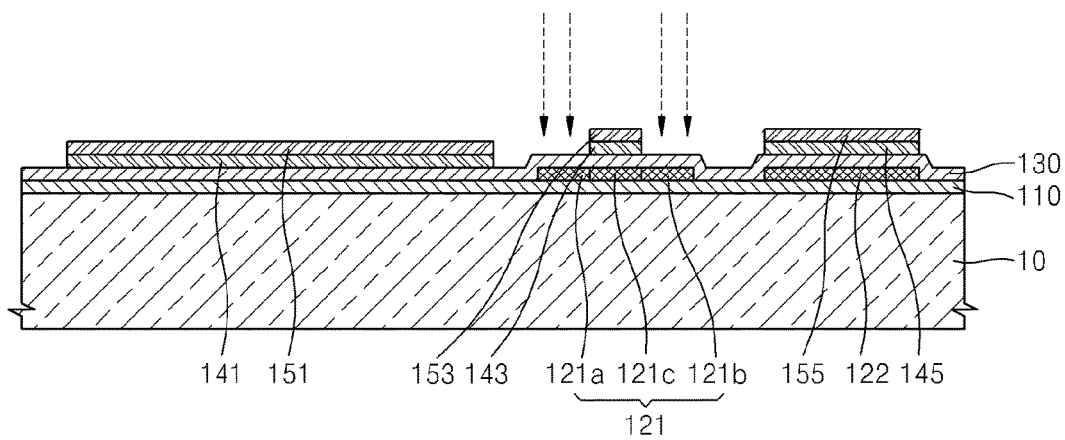

In some embodiments, referring to FIG. 8, the active layer 121 may be doped with an ion impurity by using the gate electrode 143 and 153 formed due to the second mask process, as a self align mask. As a result, the active layer 121 includes source and drain regions 121*a* and 121*b* doped with the ion impurity, and a channel region 121*c* located therebetween. In some embodiments, the source and drain regions 121*a* and 121*b* may be formed without using an additional photomask by using the gate electrode 143 and 153 as a self align mask.

In some embodiments, as illustrated in FIG. 9, a second insulating layer 160 and a third photoresist P3 are coated on the structure formed as a result of the second mask process, and a third mask process is performed by using a third photomask M3 including light blocking parts M31 and light transmitting parts M32.

Referring to FIG. 10, in some embodiments, a first opening H1 for exposing the base layer 141 and 151 of the pixel electrode, contact holes H3 and H4 for exposing the source and drain regions 121*a* and 121*b* of the TFT, and a second opening H5 for exposing the second electrode 145 and 155 of the capacitor are formed in the second insulating layer 160 as a result of the third mask process.

In some embodiments, a via hole H2 penetrating through the second insulating layer 160 may also be formed in the third mask process between the first opening H1 and the contact holes H3 and H4.

Figure 11:
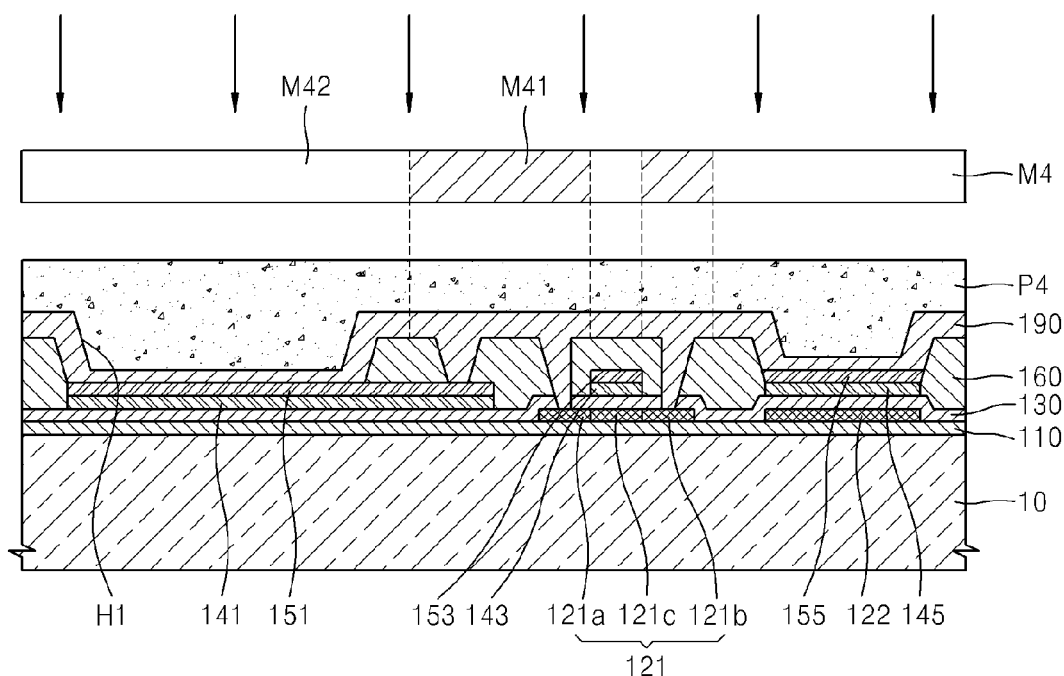

In some embodiments, referring to FIG. 11, a second metal layer 190 and a fourth photoresist P4 are formed on the structure of FIG. 10, and a fourth mask process may be performed by using a fourth photomask M4 including light blocking parts M41 and light transmitting parts M42.

In some embodiments, the second metal layer 190 may include at least one metal selected from the group consisting of Al, Pt, Pd, Ag, Mg, Au, Ni, Nd, Ir, Cr, Li, Ca, Mo, Ti, W, and Cu. In some embodiments, the second metal layer 190 shown in FIG. 11 may include Al.

In some embodiments, including a fourth mask process, a portion of the second metal layer 190 and a portion of the first metal layer 151 of the pixel electrode, which may be formed of the same material as the second metal layer 190, in the first opening H1 are etched together, the first transparent conductive layer 141 of the pixel electrode may be exposed. In some embodiments, a portion of the second metal layer 190 and the first metal layer 155 of the capacitor in the second opening H5 may be etched together.

In some embodiments, portions of the second metal layer 190 formed in the via hole H2 and the contact holes H3 and H4 of the second insulating layer 160 form source and drain electrodes 191 and 193.

Figure 12:
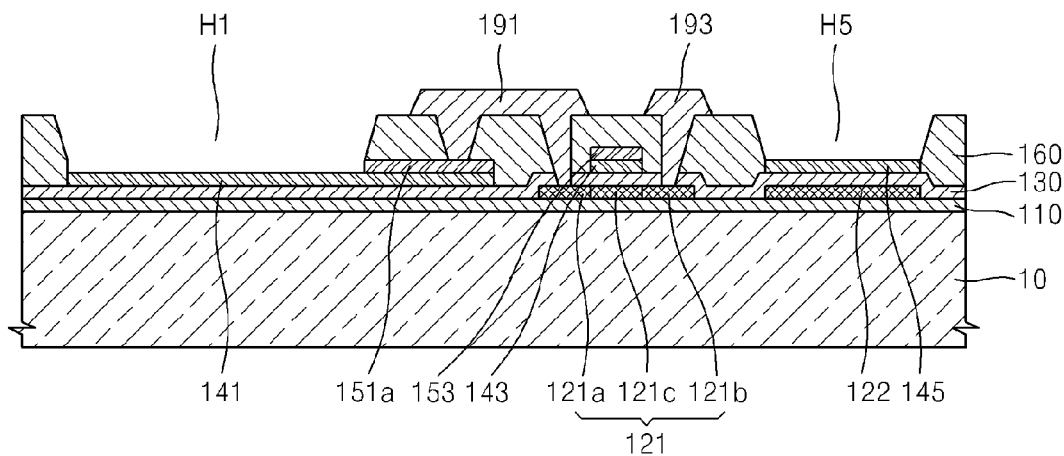

In some embodiments, referring to FIG. 12, a source and drain electrodes 191 and 193 are filled in the via hole H2 and the contact holes H3 and H4. In some embodiments, the source electrode 191 contacts the source region 121*a* and the first metal layer 151*a* that remains on the pixel electrode under the second insulating layer 160, and the drain electrode 193 contacts the drain region 121*b*.

Figure 13:
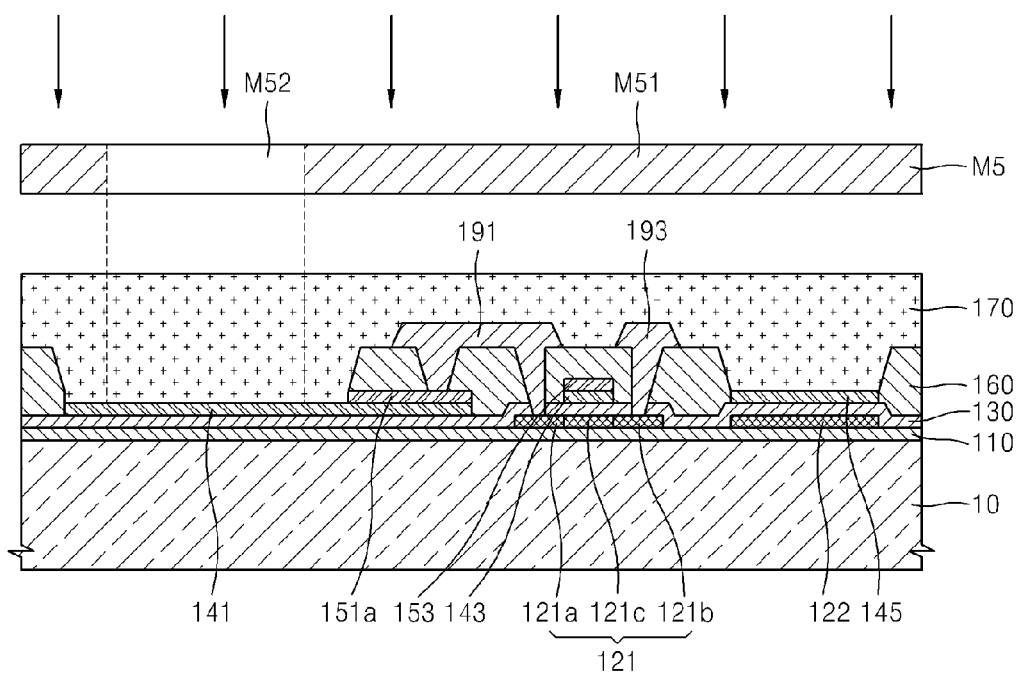

After that, as illustrated in FIG. 13, a third insulating layer 170 may be formed on the structure of FIG. 12, and a fifth mask process may be performed by using a fifth photomask M5 including light blocking parts M51 and light transmitting parts M52. In some embodiments, the third insulating layer 170 may be formed as an organic insulating layer or an inorganic insulating layer.

Figure 14A:
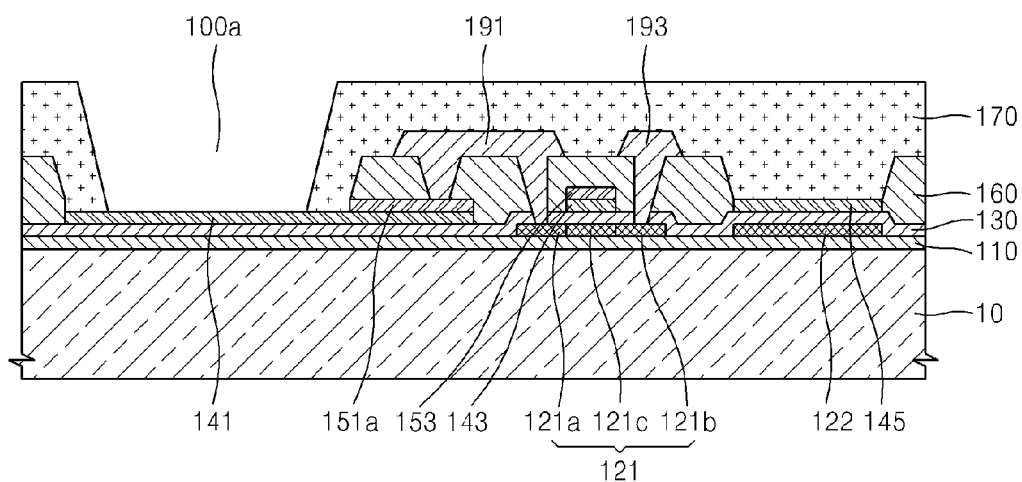
Figure 14B:
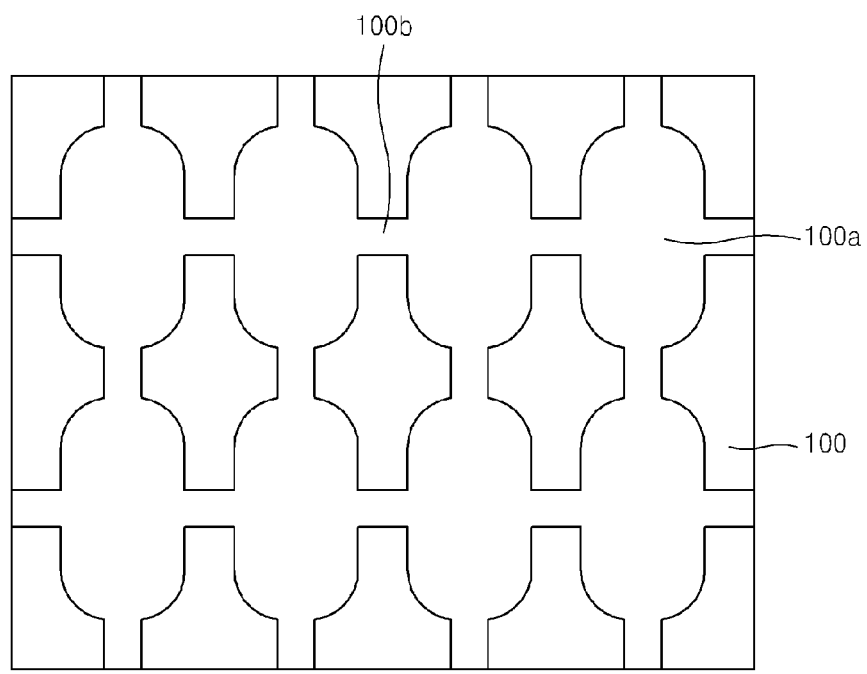

Referring to FIGS. 14A and 14B, as a result of the fifth mask process, a pixel defining layer may be formed on the source and drain electrodes 191 and 193 and edges of the first transparent conductive layer 141. The pixel defining layer exposes the first transparent conductive layer 141 of the pixel electrode.

In some embodiments, the emission regions 100*a* may be formed if the pixel defining layer exposes the first transparent conductive layer 141 of the pixel electrode. In some embodiments, the emission regions 100*a* may be formed to be partially open. Here, in addition to the emission regions 100*a*, a connection region 100*b* may be formed. In some embodiments, the connection region 100*b* may be formed similarly to the above-described method of forming the emission regions 100*a*.

The non-emission region layer 100 is not limited to the above-described method and may be formed by using various methods. For example, although the number of masks is limited in the above description, the non-emission region layer 100 may be formed by using a different number and different forms of masks.

In some embodiments, referring to FIGS. 15 through 17, if the emission regions 100*a* may be formed as described above, the encapsulation layer 400 may be formed on the non-emission region layer 100. In some embodiments, the encapsulation layer 400 may be formed on the non-emission region layer 100 where the emission regions 100*a* and the connection region 100*b* are not formed.

Figure 15A:
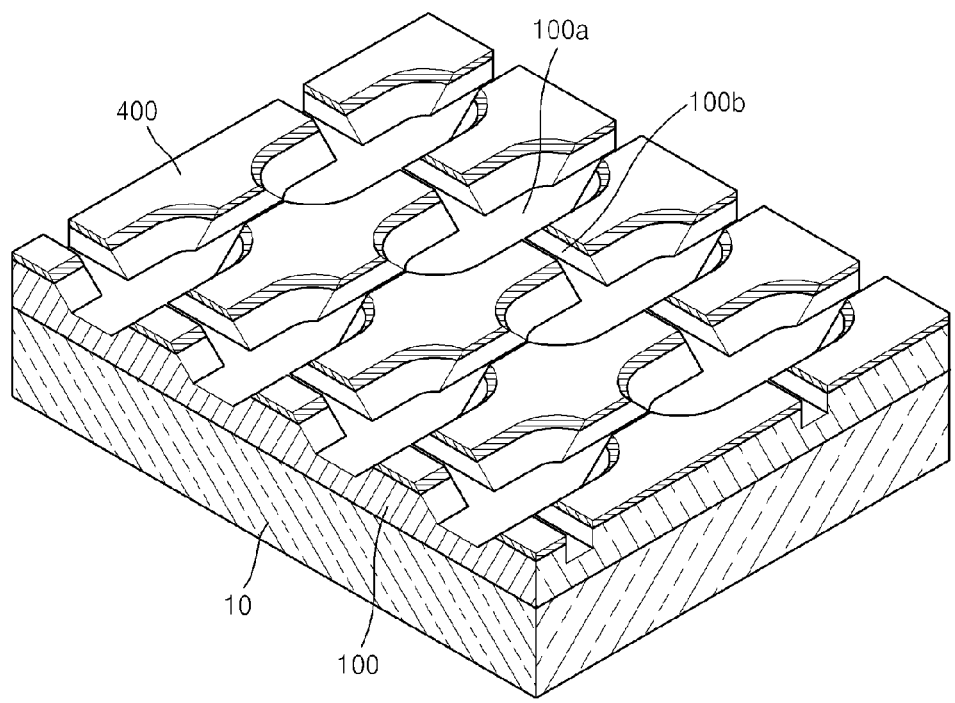
Figure 15B:
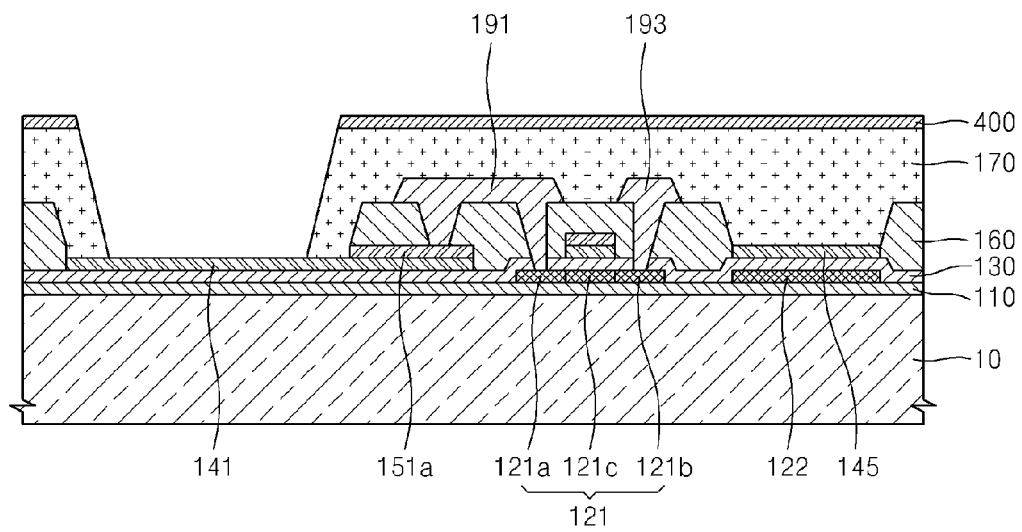
Figure 15C:
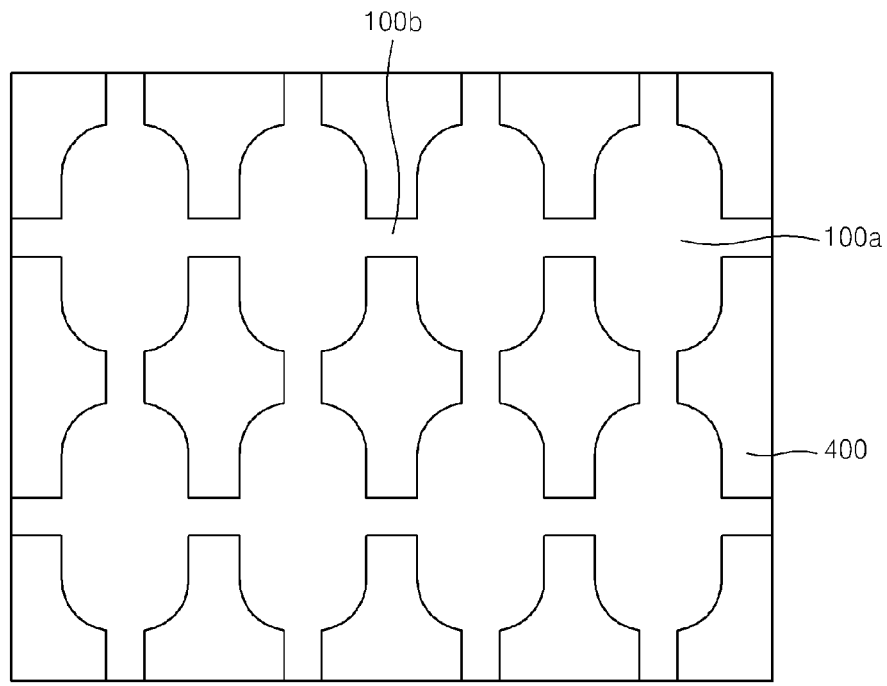

Referring to FIGS. 15A through 15C, as described above in relation to FIG. 1, the encapsulation layer 400 may include a low liquidus temperature material and may be patterned on the non-emission region layer 100.

In some embodiments, the encapsulation layer 400 may be formed on the non-emission region layer 100 by using a mask. In some embodiments, the mask may cover a portion where the counter electrode 300 is formed when the encapsulation layer 400 is formed.

In some embodiments, the encapsulation layer 400 may be formed by using a general lithography process when the encapsulation layer 400 is patterned. Accordingly, the encapsulation layer 400 may be patterned on the non-emission region layer 100 where the counter electrode 300 is not formed. In some embodiments, the encapsulation layer 400 may be formed on the non-emission region layer 100 where the emission regions 100a and the connection region 100b are not formed.

Figure 16A:
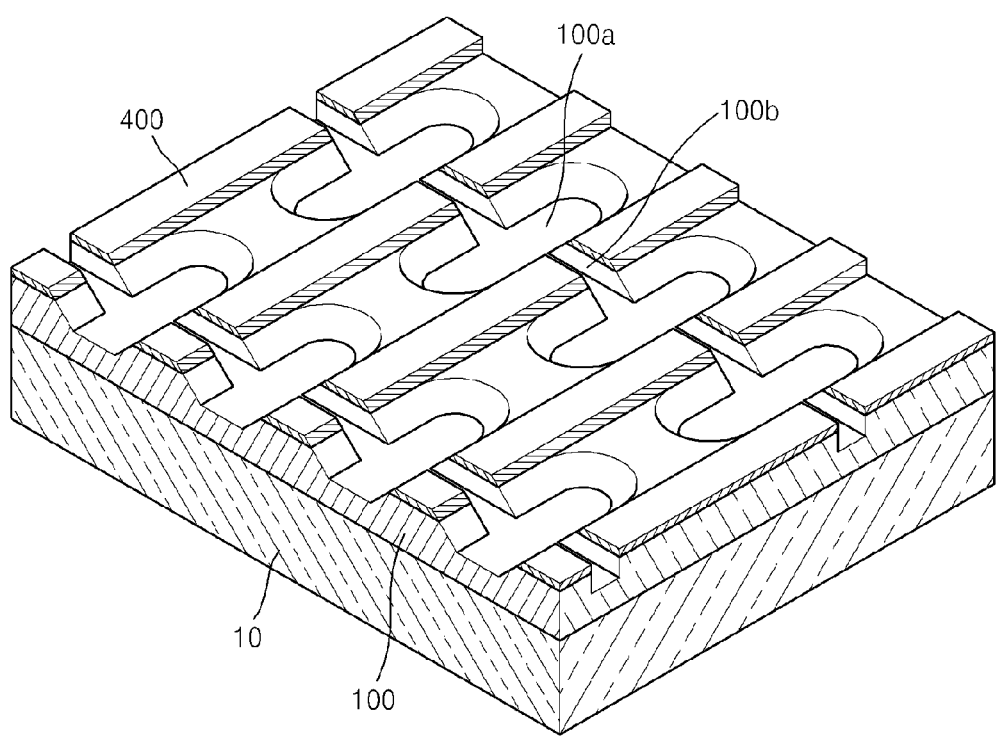

In some embodiments, referring to FIG. 16A, the encapsulation layer 400 may be formed on the non-emission region layer 100 in various forms. In some embodiments, the encapsulation layer 400 may be formed on the non-emission region layer 100 in the form of strips. For example, the encapsulation layer 400 may be formed between the emission regions 100a.

Figure 17A:
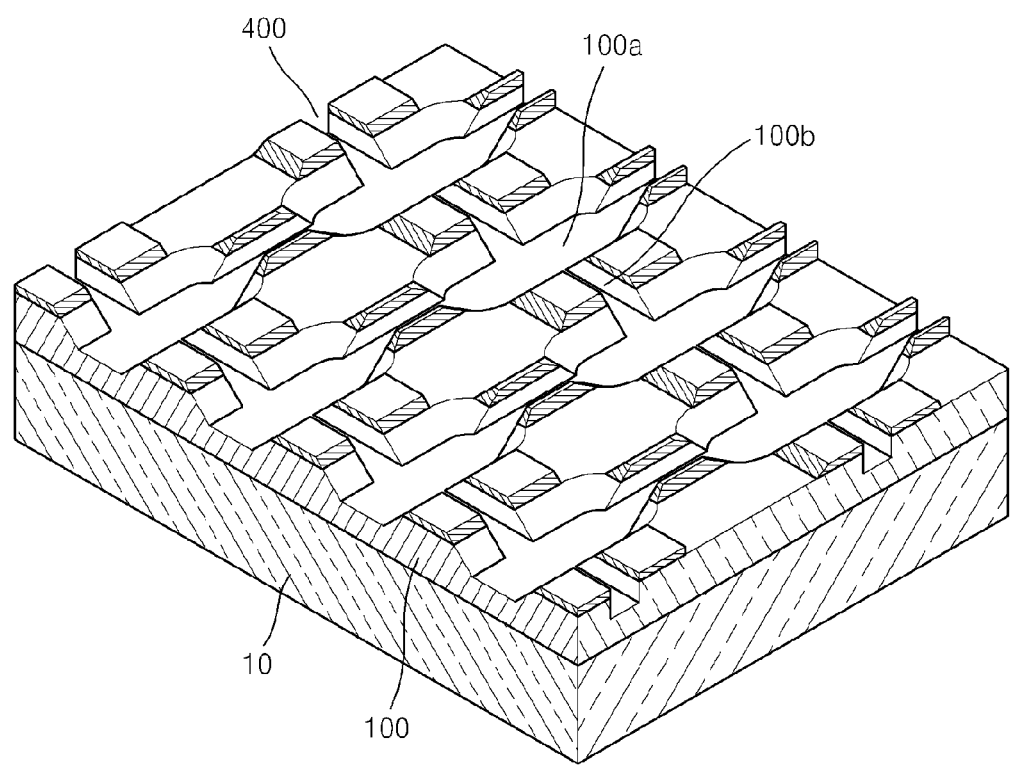

In some embodiments, referring to FIG. 17A, in addition to the above-described form, the encapsulation layer 400 may be formed on the non-emission region layer 100 in the form of Islands. For example, the encapsulation layer 400 may be formed on only portions of regions between the emission regions 100a, and patterns of the encapsulation layer 400 may be spaced apart from each other by a certain distance.

In some embodiments, referring to FIGS. 15D, 15E, 16B, and 17B, the organic emission layer 200 and the counter electrode 300 are formed above the pixel electrode. In this case, the organic emission layer 200 may be formed of a low-molecular or high-molecular organic material.

In some embodiments, the organic emission layer 200 may be included in an intermediate layer (not shown) if the organic emission layer 200 is formed of a low-molecular organic material. In some embodiments, the intermediate layer may be formed on the pixel electrode and the non-emission region layer 100.

As the intermediate layer, with respect to the organic emission layer 200, a hole transporting layer (HTL), a hole injection layer (HIL), etc. may be stacked in a direction toward the pixel electrode, and an electron transporting layer (ETL), an electron injection layer (EIL), etc. are stacked in a direction toward a second electrode layer.

In addition to the above-mentioned layers, various layers may be stacked according to necessity. In this case, various organic materials such as copper phthalocyanine (CuPc), N,N'-Di(naphthalene-1-yl)-N,N'-diphenyl-benzidine (NPB), and tris-8-hydroxyquinoline aluminum (Alq3) may be used.

In some embodiments, if the organic emission layer 200 is formed of a high-molecular organic material, as the intermediate layer, only an HTL may be in a direction toward the pixel electrode with respect to the organic emission layer 200. In some embodiments, the HTL may be formed of poly-(2,4)-ethylene-dihydroxythiophene (PEDOT) or polyaniline (PANI) and may be formed by using an inkjet printing method or a spin coating method. In this case, poly-phenylenevinylene (PPV)-based and polyfluorene-based high-molecular organic materials may be used, and a color pattern may be formed by using a general method such as an inkjet printing method, a spin coating method, or a thermal transfer printing method using a laser.

In some embodiments, the intermediate layer including the organic emission layer 200 may realize an optical resonance structure by varying the thickness of the organic emission layer 200 or the thickness of another organic emission layer (not shown) other than the organic emission layer 200, according to pixels.

Hereinafter, for convenience of explanation, a representative embodiment when the intermediate layer is not formed will be representatively described in detail.

In some embodiments, the counter electrode 300 may be vapor-deposited on the non-emission region layer 100 after the organic emission layer 200 is formed as described above, as a common electrode. In some embodiments, as described above in relation to FIG. 1, the counter electrode 300 may include the first counter electrodes 310 formed on the organic emission layers 200, and the second counter electrode 330 formed between patterns of the encapsulation layer 400.

In some embodiments, the first counter electrodes 310 may be formed on the organic emission layers 200, and the second counter electrode 330 may connect the first counter electrodes 310 if the counter electrode 300 is formed as described above. In some embodiments, the first counter electrodes 310 may be formed in the emission regions 100a, and the second counter electrode 330 may be formed in the connection region 100b. In some embodiments, the second counter electrode 330 may be formed on the non-emission region layer 100 where the encapsulation layer 400 is not formed, as well as in the connection region 100b.

Figure 15D:
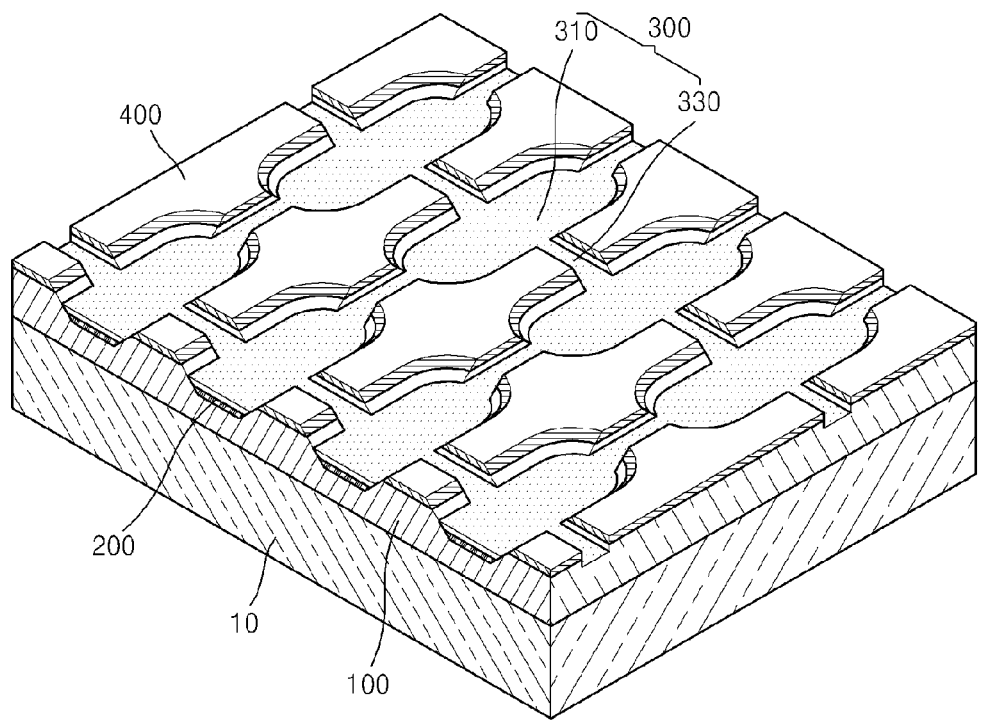
Figure 15E:
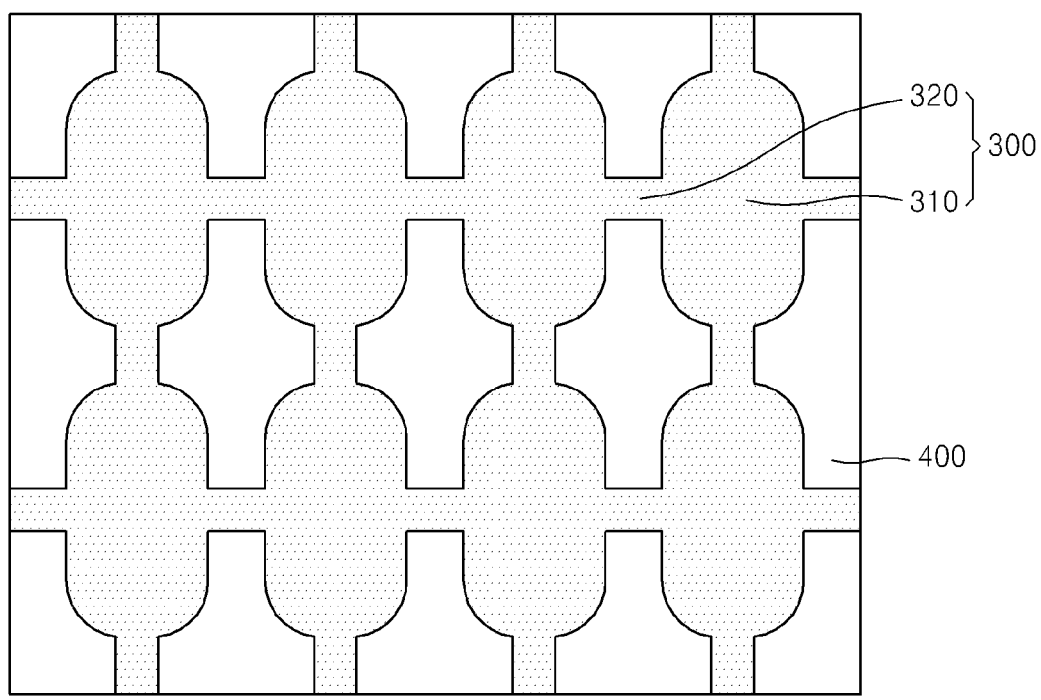
Figure 15F:
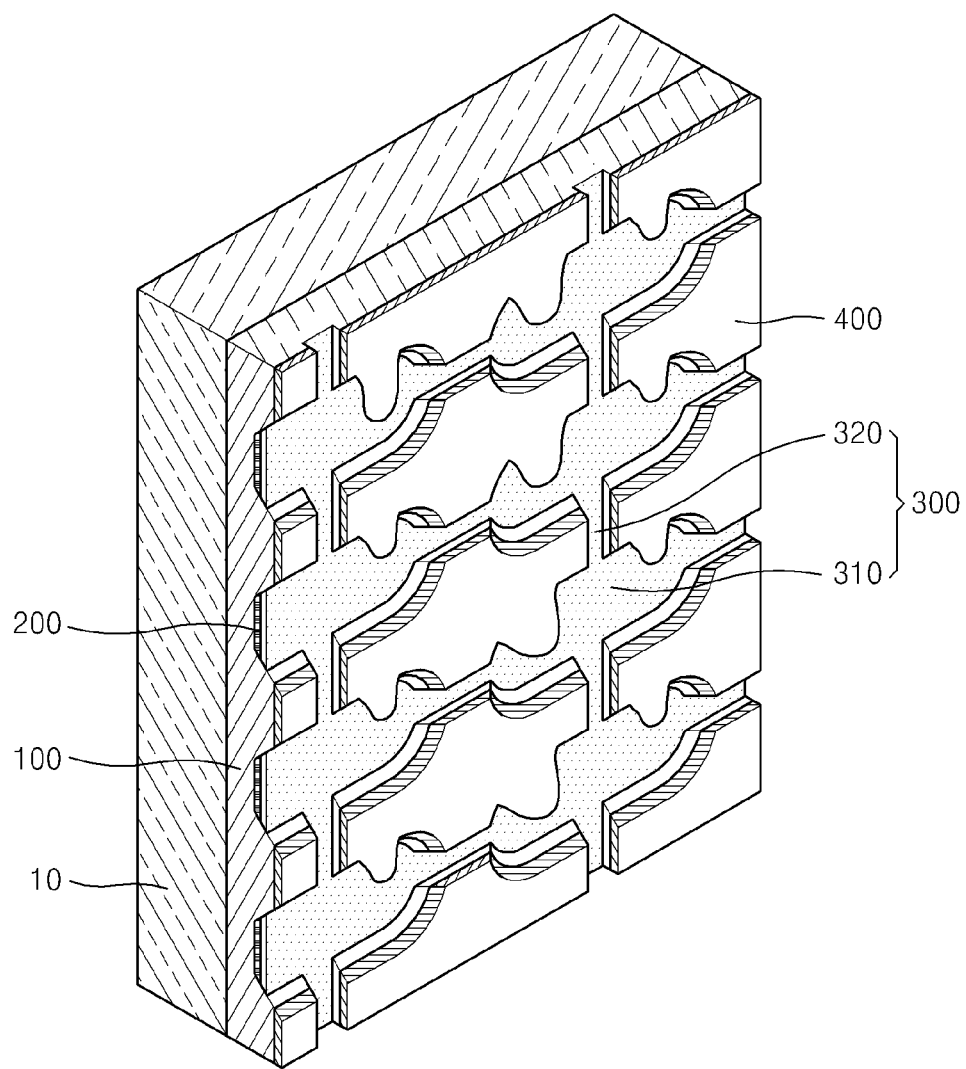

In some embodiments, referring to FIG. 15D, after the encapsulation layer 400 is formed as described above, the emission regions 100a and the connection region 100b may be coated with the counter electrode 300. In some embodiments, as described above in relation to FIG. 1, the counter electrode 300 may be coated in the connection region 100b to connect adjacent emission regions 100a.

Figure 16B:
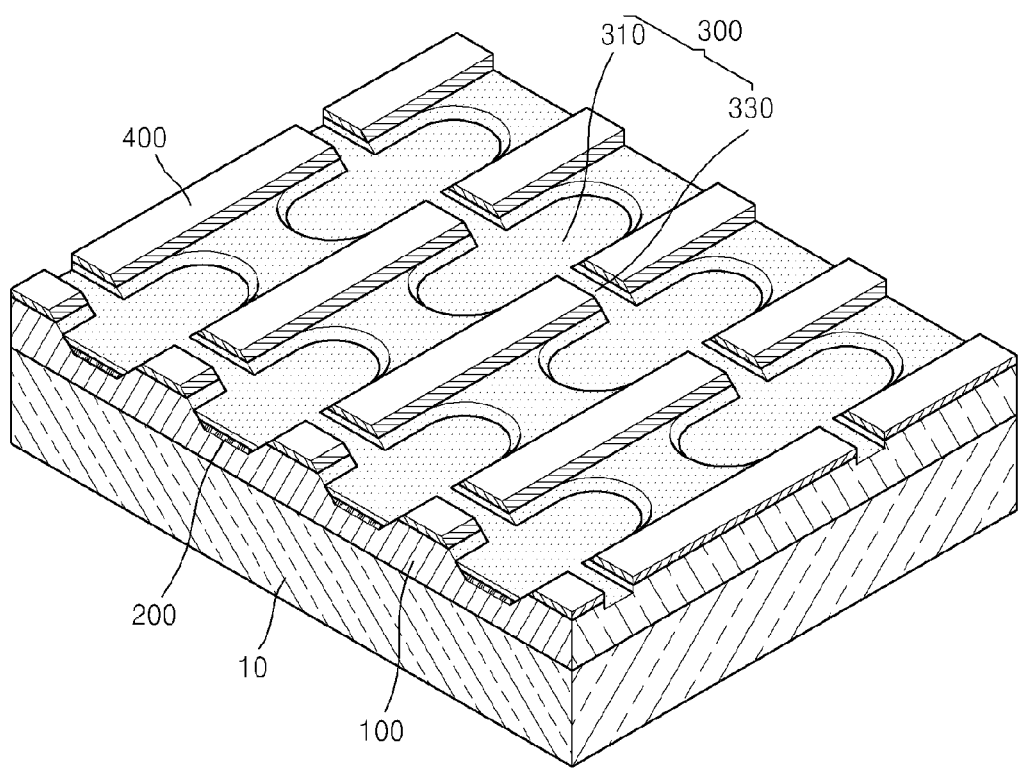
Figure 16C:
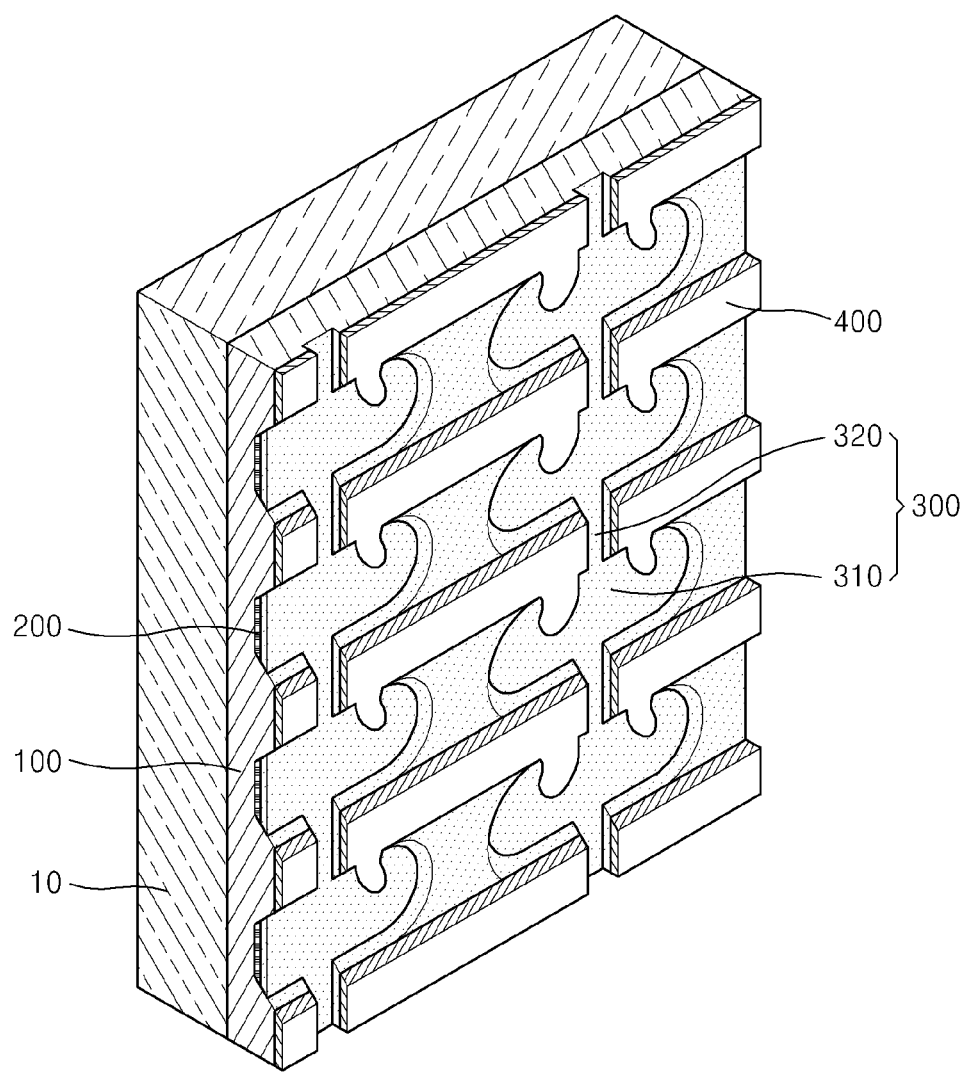

In some embodiments, referring to FIG. 16B, the encapsulation layer 400 may be formed in the form of strips as described above in relation to FIG. 16A, and then the counter electrode 300 may be formed. In some embodiments, the counter electrode 300 may be coated on the non-emission region layer 100 where the encapsulation layer 400 is not formed.

In some embodiments, the counter electrode 300 may be formed in the emission regions 100a and the connection region 100b, and may also be formed near the emission regions 100a where the encapsulation layer 400 is not formed.

In some embodiments, the counter electrode 300 may connect the first counter electrodes 310 formed in adjacent emission regions 100a, to the second counter electrode 330. In some embodiments, the first counter electrodes 310 formed in the emission regions 100a may be larger than the emission regions 100a and thus adjacent first counter electrodes 310 may be connected to each other.

Figure 17B:
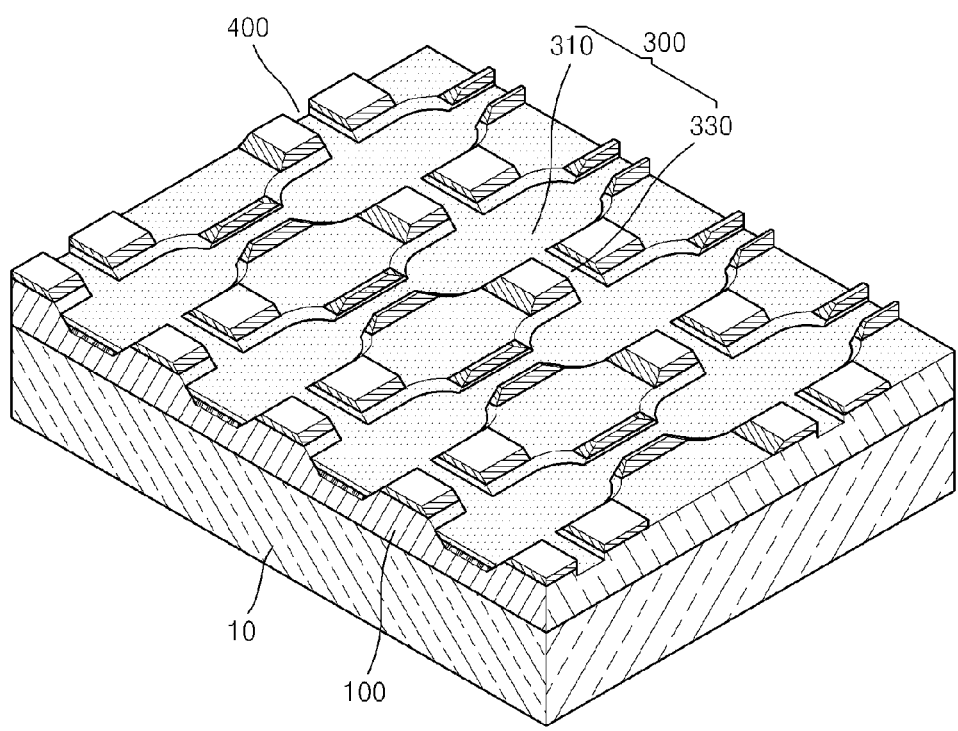
Figure 17C:
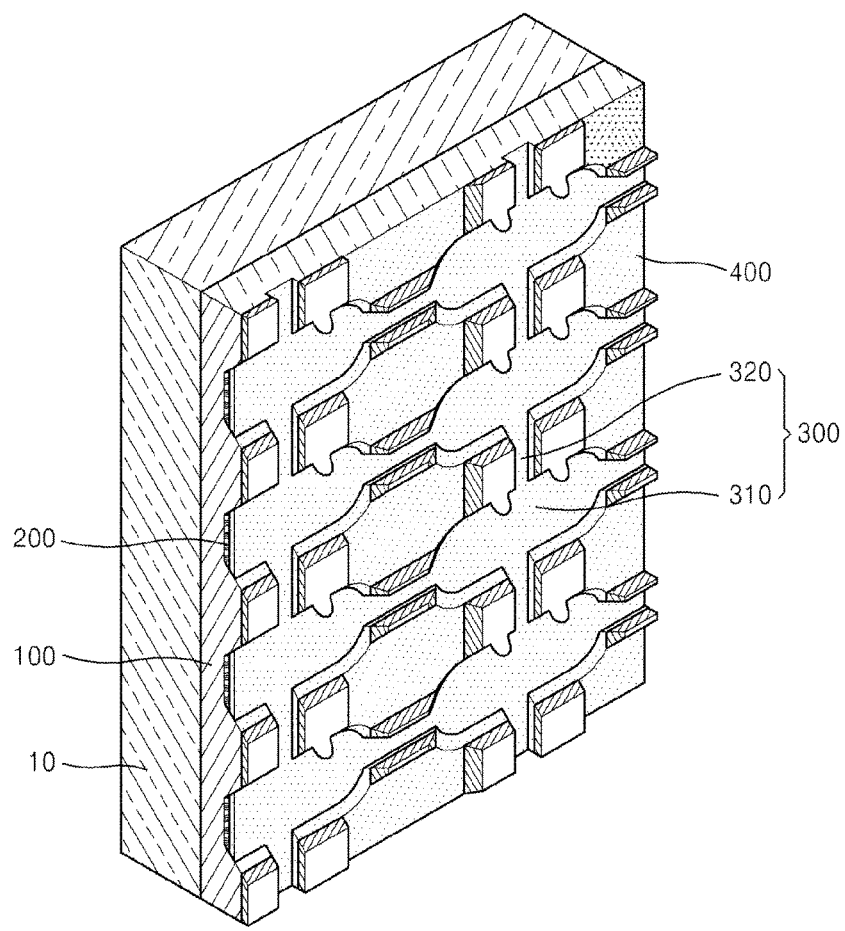
Figure 18:
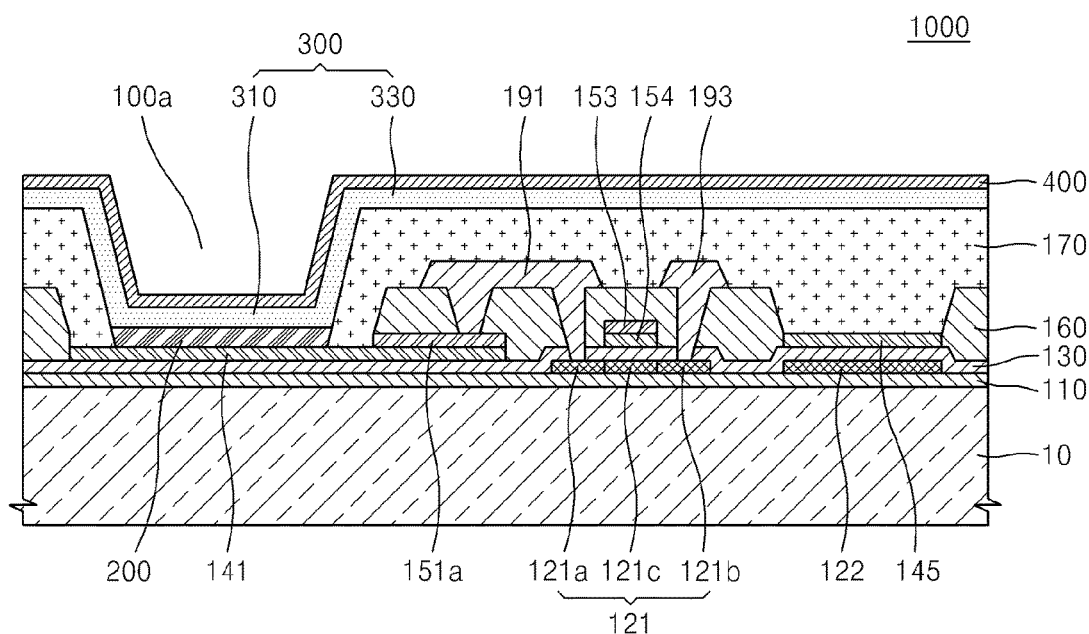

Referring to FIG. 17B, if the encapsulation layer 400 is formed in the form of islands, the counter electrode 300 may also be formed on the non-emission region layer 100 where the encapsulation layer 400 is not formed.

In some embodiments, where the first counter electrodes 310 are connected to the second counter electrode 330 and the counter electrode 300 is formed, as described above, on the non-emission region layer 100 where the encapsulation layer 400 is not formed, adjacent first counter electrodes 310 may be connected to each other.

In some embodiments, the pixel electrode is used as an anode and the counter electrode 300 is used as a cathode, or vice versa.

In some embodiments, the counter electrode 300 may be formed as a reflective electrode including a reflective material and may function as a reflective mirror for reflecting light emitted from the organic emission layer 200 in order to realize an optical resonance structure. In some embodiments, the counter electrode 300 may include at least one selected from the group consisting of aluminum (Al), magnesium (Mg), lithium (Li), calcium (Ca), lithium fluoride/calcium (LiF/Ca), and lithium fluoride/aluminum (LiF/Al).

In some embodiments, referring to FIGS. 15F, 16C, 17C, and 18, if the counter electrode 300 is completely formed as described above, the display panel 1000 may be exposed to an environment equal to or less than 200° C. In this case, if the display panel 1000 is exposed as described above, the encapsulation layer 400 formed on the counter electrode 300 may be melted.

In some embodiments, if the display panel 1000 is tilted by a certain angle with respect to the ground surface, the encapsulation layer 400 may flow toward the counter electrode 300. In some embodiments, the display panel 1000 may repeatedly rotate horizontally or vertically when the display panel 1000 is tilted by a certain angle as described above.

In some embodiments, the encapsulation layer 400 may cover surfaces of the first counter electrodes 310 and the second counter electrode 330 formed in the emission regions 100a if the display panel 1000 moves as described above.

If the encapsulation layer 400 is formed as described above, during the encapsulation layer 400 is formed to seal the counter electrode 300 and the organic emission layer 200, the organic emission layer 200 that is vulnerable to heat may be prevented from being damaged due to heat.

In some embodiments, the counter electrode 300 may be simply and rapidly sealed during the manufacturing method of the display panel 1000. In some embodiments, a high reliability against an external impact may be ensured and a life time of the display panel 1000 may be increased since a low liquidus temperature material is used in sealing.

Some embodiments provide a counter electrode that may be simply and rapidly sealed. Also, since a low liquidus temperature material is used in sealing, a high reliability against an external impact may be ensured and a life time of a display panel may be increased.

While embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A manufacturing method of a display panel, the method comprising:
    forming a non-emission region layer having a plurality of emission regions and a connection region that is open to connect adjacent emission regions;
    forming an encapsulation layer on the non-emission region layer where the plurality of emission regions and the connection region are not formed, the encapsulation layer formed in a region that is not a pixel area of a display portion;
    forming an organic emission layer in each of the emission regions;
    forming a counter electrode in the emission regions and the connection region; and
    melting the encapsulation layer to cover and seal the counter electrode,
    wherein melting the encapsulation comprises tilting the non-emission region layer, the encapsulation layer, the organic emission layer by a certain angle with respect to a ground surface while melting the encapsulation layer to cover and seal the counter electrode, and
    wherein the encapsulation layer directly contacts the counter electrode after melting the encapsulation layer to cover and seal the counter electrode.

2. The method of claim 1, wherein the second step further comprising forming a mask having a light blocking part and a light transmitting part for blocking the emission regions and the connection region and patterning the encapsulation layer on the non-emission region layer by using the mask.

3. The method of claim 1, wherein the encapsulation layer is formed on at least a portion of the non-emission region layer.

4. The method of claim 1, wherein the forming a counter electrode in the emission regions and the connection region, and melting the encapsulation layer to seal the counter electrode comprises a step of melting the encapsulation layer to a temperature equal to or less than 200° C.

5. The method of claim 1, wherein the counter electrode comprises:
    a plurality of first counter electrodes individually formed on the organic emission layers; and
    a second counter electrode for connecting the plurality of first counter electrodes.

6. The method of claim 1, wherein the encapsulation layer is formed of a low liquidus temperature material.

7. The method of claim 6, wherein the low liquidus temperature material comprises at least one of tin fluorophosphates glass, tungsten-doped tin fluorophosphates glass, chalcogenide glass, tellurite glass, borate glass, and phosphate glass.

8. The method of claim 7, wherein the tin fluorophosphates glass comprises 20 to 80 weight % of tin (Sn), 2 to 20 weight % of phosphorus (P), 3 to 20 weight % of oxygen (O), and 10 to 36 weight % of fluorine (F).

9. The method of claim 1, wherein the encapsulation layer is discontinuous when formed.

10. The method of claim 9, wherein the encapsulation layer is formed in the form of islands.

11. The method of claim 9, the formed encapsulation layer is formed in the form of strips.

* * * * *